United States Patent
Faue

(10) Patent No.: US 7,830,734 B2
(45) Date of Patent: Nov. 9, 2010

(54) ASYMETRIC DATA PATH POSITION AND DELAYS TECHNIQUE ENABLING HIGH SPEED ACCESS IN INTEGRATED CIRCUIT MEMORY DEVICES

(75) Inventor: Jon Allan Faue, Colorado Springs, CO (US)

(73) Assignee: ProMOS Technologies Pte. Ltd., Singapore (SG)

( * ) Notice: Subject to any disclaimer, the term of this patent is extended or adjusted under 35 U.S.C. 154(b) by 213 days.

(21) Appl. No.: 12/049,248

(22) Filed: Mar. 14, 2008

(65) Prior Publication Data

US 2009/0231945 A1    Sep. 17, 2009

(51) Int. Cl.
*G11C 7/00*    (2006.01)
(52) U.S. Cl. ............. 365/194; 365/189.19; 365/230.03; 365/230.06
(58) Field of Classification Search ................. 365/194, 365/189.19, 230.03, 230.06
See application file for complete search history.

(56) References Cited

U.S. PATENT DOCUMENTS

| | | | |
|---|---|---|---|
| 4,725,945 A | 2/1988 | Kronstadt et al. | |
| 5,663,921 A | 9/1997 | Pascucci et al. | |
| 5,752,260 A | 5/1998 | Liu | |
| 5,818,785 A | 10/1998 | Ohshima | |
| 5,883,814 A | 3/1999 | Luk et al. | |
| 5,893,151 A | 4/1999 | Merchant | |
| 6,115,795 A | 9/2000 | Gilda et al. | |
| 6,185,146 B1 | 2/2001 | Shioyama et al. | |
| 6,446,249 B1 | 9/2002 | Wang et al. | |
| 6,658,523 B2 | 12/2003 | Janzen et al. | |
| 6,662,271 B2 | 12/2003 | Smits | |
| 7,039,822 B2 | 5/2006 | Faue et al. | |
| 2002/0138700 A1 | 9/2002 | Holmberg | |
| 2004/0057304 A1* | 3/2004 | Smits | 365/200 |
| 2004/0172569 A1* | 9/2004 | Faue et al. | 713/400 |

\* cited by examiner

*Primary Examiner*—Hoai V Ho
(74) *Attorney, Agent, or Firm*—William J. Kubida; Scott J. Hawranek; Hogan Lovells US LLP

(57) ABSTRACT

An asymmetric data path position and delays technique enabling high speed access in integrated circuit memory devices which is asymmetric in terms of the delay from the array to the I/O buffers based on the position relative within a known starting address of a pre-fetch field. In accordance with the technique of the present invention, the delay is not only asymmetric in terms of its physical length, but also in the number of pipeline stages and the clocks that control them and can also be asymmetric in terms of the column address required to access each section of the array and its designated pre-fetch field.

8 Claims, 2 Drawing Sheets

ASYMETRIC DATA PATH POSITION AND DELAYS TECHNIQUE ENABLING HIGH SPEED ACCESS IN INTEGRATED CIRCUIT MEMORY DEVICES

BACKGROUND OF THE INVENTION

The present invention relates, in general, to the field of integrated circuit memory devices. More particularly, the present invention relates to an asymmetric data path position and delays technique enabling high speed access in integrated circuit memory devices.

Many types of DRAM based devices are currently available including extended data out ("EDO"), synchronous DRAM ("SDRAM"), double data rate ("DDR"), DDR3 DRAM and the like. Regardless of configuration, the primary purpose of the DRAM is to store data. Functionally, data may be written to the memory, read from it or periodically refreshed to maintain the integrity of the stored data. In current high density designs, each DRAM memory cell generally comprises a single access transistor coupled to an associated capacitor (i.e. a 1T/1C design) that may be charged to store a value representative of either a logic level "1" or "0". Data stored in these memory cells may be read out and written to them through columns of sense amplifiers coupled to complementary bitlines interconnecting rows of these cells.

In some conventional DRAM designs, the column field of the memory banks is sub-divided by the pre-fetch size. However, since the pre-fetch can start with any address within the pre-fetch field, there can be no preference in the physical placement of the column field within the bank. That is, that portion of the column pre-field which is physically the farthest away will determine the worst case, or slowest, access time.

SUMMARY OF THE INVENTION

In accordance with the asymmetric data path position and delays technique of the present invention, for memories which have a fixed, or at least limited, pre-fetch starting address, the data required first can be positioned nearer the device input/output (I/O) pads thus optimizing its data path to the shortest and fastest possible route. Moreover, the data path associated with this fast access can be designed with a simpler and faster pipeline scheme thereby further reducing any associated delays In accordance with the disclosed technique, even the column address bus can be divided (or segmented) to delay access into the slow field thereby speeding up access into the fast field.

Within the memory banks, the column address field associated with the first pre-fetch data needed in a read access is positioned closest to the main peripheral data bus. In certain memory device architectures, for example, this would be closest to the center line. The last data needed is then positioned the farthest away.

In this particular example then, the data line for at least the first pre-fetch group is shared across the device center line thereby eliminating a clock in the data and associated gates in the data path. The longer data lines can have an additional clock to decide which half, top or bottom, is to be placed onto the main data bus. The later bits in the pre-fetch field, by definition, have more time available before they are needed at the output buffer so they can afford extra delays in the data path.

As utilized herein, the following terms are defined as follows:

Bank—A group of memory sub-arrays with a distinct address. Banks are typically arranged in a memory such that different banks can have different row addresses activated at the same time. For a read operation, all the bits for a given pre-fetch size are sensed and sent to the main amplifiers simultaneously. This is generally necessary in order to maintain synchronization with the column address bus and any possible pre-charge requirements.

Main Amplifier—As the data lines connecting to all the sense amplifiers within a bank are generally heavily loaded (capacitance), they are usually made up of a differential pair which carries only small voltage differences for reading. As such, these differences must be sensed by another "emain" amplifier besides the column sense amplifier which actually couples to the bitlines. In the ensuing description, these bank data lines are referred to as the complementary F lines. (F and /F)

I/O pins—(Input/Output pins) The point of the integrated circuit design that actually communicates data to the network outside the device itself. These are also sometimes referred to as DQ pins. These drive data in (I) when writing and drive data out when reading (O).

Data Path (or Data Bus)—The data lines that connect the banks to the I/O pins. There are at least one line per I/O pin. However, in a particular implementation, there may be X per I/O pin (where X is the number of bits pre-fetched from the array for any given read access).

Y-select—The column select line and is based on the decoded column address that was input to the integrated circuit device for a read or write operation.

G-clk—The clock signal that enables data to flow from the main amplifier (bank based) to the global G-bus.

GHCLK—The clock signal that enables data from the G-bus to the H-bus. It should be noted that, in a particular implementation of the technique of the present invention, the fast group of pre-fetched bits need not have an H-bus. In this instance, the G-data may be coupled directly to the I-bus.

HICLK—The clock signal that enables data from the H-bus to the I-Bus.

FICLK—The clock signal that controls the input of the data on the I-lines into the FIFO register assigned to each individual I/O buffer.

Pre-Fetch—to retrieve a block of data in advance. As an example, for each read command retrieve a total of 4 bits per I/O. The bits specified by the column address corresponding to the read command and also the next 3 that will be needed. The I/O buffer will eventually shift these out serially.

Particularly disclosed herein is an integrated circuit device which comprises a memory array including at least one memory bank, the memory bank having a plurality of associated column address fields. A first one of the column address fields which is associated with first pre-fetch data for a read access to the memory array is located most proximate to a main data bus of the memory array. In a particular implementation, a second one of the column address fields which is associated with secondary pre-fetch data for a read access to the memory array is located farther from the main data bus of the memory array.

Also particularly disclosed herein is an integrated circuit device comprising a memory array including at least one memory bank presenting a plurality of column address fields. A separate data bus is coupled to each of the plurality of column address fields of the memory bank and to a main data bus of the memory array wherein at least two of the separate data buses present asymmetric delays from the column address fields to the main data bus based upon a starting address of a pre-fetch field.

Still further disclosed herein is an integrated circuit device comprising a memory array including a plurality of memory banks, with each of the memory banks having a number of corresponding column address fields wherein at least two of the corresponding column address fields present asymmetric re-driving delays to a main data bus of the memory array.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
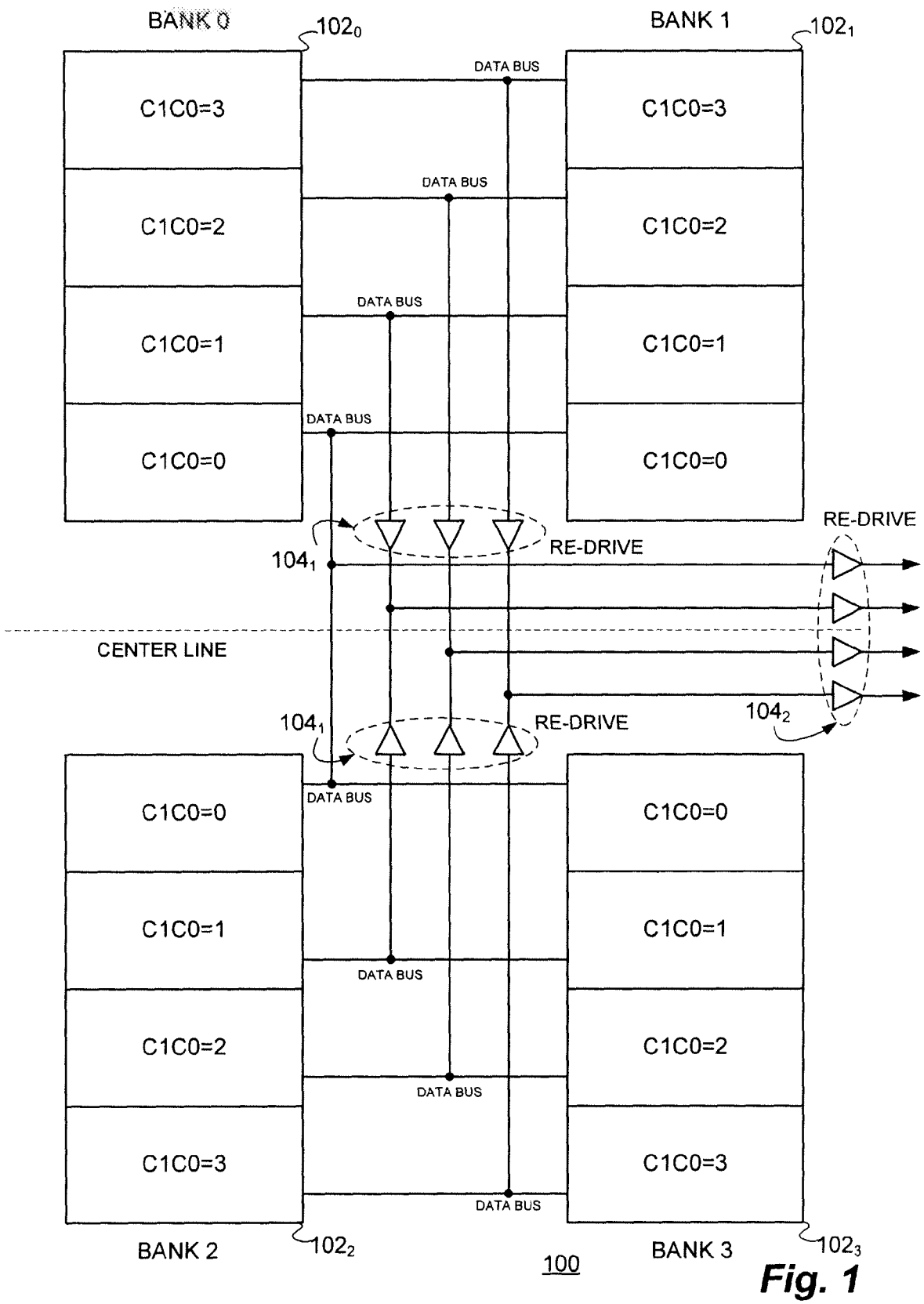
FIG. 1 is an architectural block diagram of a representative memory bank configuration for an integrated circuit memory device illustrating a possible data bus implementation of the asymmetric data path position and delays technique of the present invention.

With reference now to FIG. 1, an architectural block diagram of a representative memory bank configuration for an integrated circuit memory device 100 is shown illustrating a possible data bus implementation of the asymmetric data path position and delays technique of the present invention.

The memory device 100 comprises, in the representative embodiment illustrated, four memory banks $102_0$ through $102_3$ denominated BANK 0 through BANK 3 respectively. Each of the memory banks $102_0$ through $102_3$ comprises a number of sub-arrays with addresses C1C0=0, C1C0=1, C1C0=2 and C1C0=3 as shown, with the C1C0=0 sub-arrays being located adjacent to the memory device 100 center line.

In this respect, C1 is the A<1> column address while C0 is the A<0> column address. In combination they comprise the C1C0 or C10 address where the binary notations 00, 01, 10 and 11 equal the decimal values 0, 1, 2 and 3 respectively.

The data bus for the C1C0=0 sub-arrays in each of the memory banks $102_0$ through $102_3$ are all coupled together as shown. In contrast, the data bus for the C1C0=1, C1C0=2 and C1C0=3 sub-arrays for the memory banks $102_0$ and $102_1$ are respectively coupled together and then re-driven by a re-driver circuit $104_1$ before reaching the device 100 center line. Similarly, the data bus for the C1C0=1, C1C0=2 and C1C0=3 sub-arrays for the memory banks $102_2$ and $102_3$ are respectively coupled together and then also re-driven by another re-driver circuit $104_1$ before reaching the device 100 center line. An additional re-driver circuit $104_2$ is them employed to re-drive the common coupled C1C0=0 sub-array data buses and the previously re-driven C1C0=1, C1C0=2 and C1C0=3 sub-array data buses before reaching the device 100 I/O pads.

For Graphics DDR3 (GDDR3) devices, or any DRAM device with a fixed pre-fetch starting address, the architecture of the I/O's column mapping can be optimized in accordance with the technique of the present invention to speed up the read delay time ($t_{aa}$). GDDR3 chips typically have a 4-bit pre-fetch per I/O, but the starting address is limited to C1=0 C0=0 (A1 and AØ column addresses). Therefore, in accordance with the technique of the present invention, the bits in a particular I/O field assigned to C1C0=0 are placed closest to the device periphery so their data path to the I/O pads is the shortest and the fastest.

The G-lines, that portion of the data bus coupled to the memory banks $102_0$ through $102_3$, can still be shared across the horizontal boundary, or center line, of the periphery as the total load from the two combined "short" sides is still small, the C1C0=Ø lines being the short ones. The G-lines for the latter part of the pre-fetch, C1C0=1, C1C0=2 and C1C0=3 are not shared across the horizontal boundary because their loads would generally be too great. As such, they optimally require re-driving through re-driver circuit $104_1$ before coupling onto the peripheral data bus. However, their speed requirements are not as critical. The C1C0=0 data must meet the $t_{aa}$ specification requirements. The C1C0=1 then gets an extra ½ $t_{ck}$, C1C0=2 a whole extra $t_{ck}$, C1C0=3 gets an extra 1 $t_{ck}$ for the $t_{aa}$ margin. It should be noted that the total gate delays in the C1C0=0 path are less than in the other cases, also effectively reducing any delay in that path.

As previously described and illustrated, for the sub-arrays C1C0=0 there is a single re-drive through re-driver circuit $104_2$. For C1C0=1, C1C0=2 and C1C0=3 there are two re-drives through both of re-driver circuits $104_1$ an $104_2$. In this regard, the staggered nature of the C1C0=0 G-line connection points is illustrated and the farthest from center line for memory banks $102_0$ and $102_1$ is also the closest for memory banks $102_2$ and $102_3$.

Figure 2:
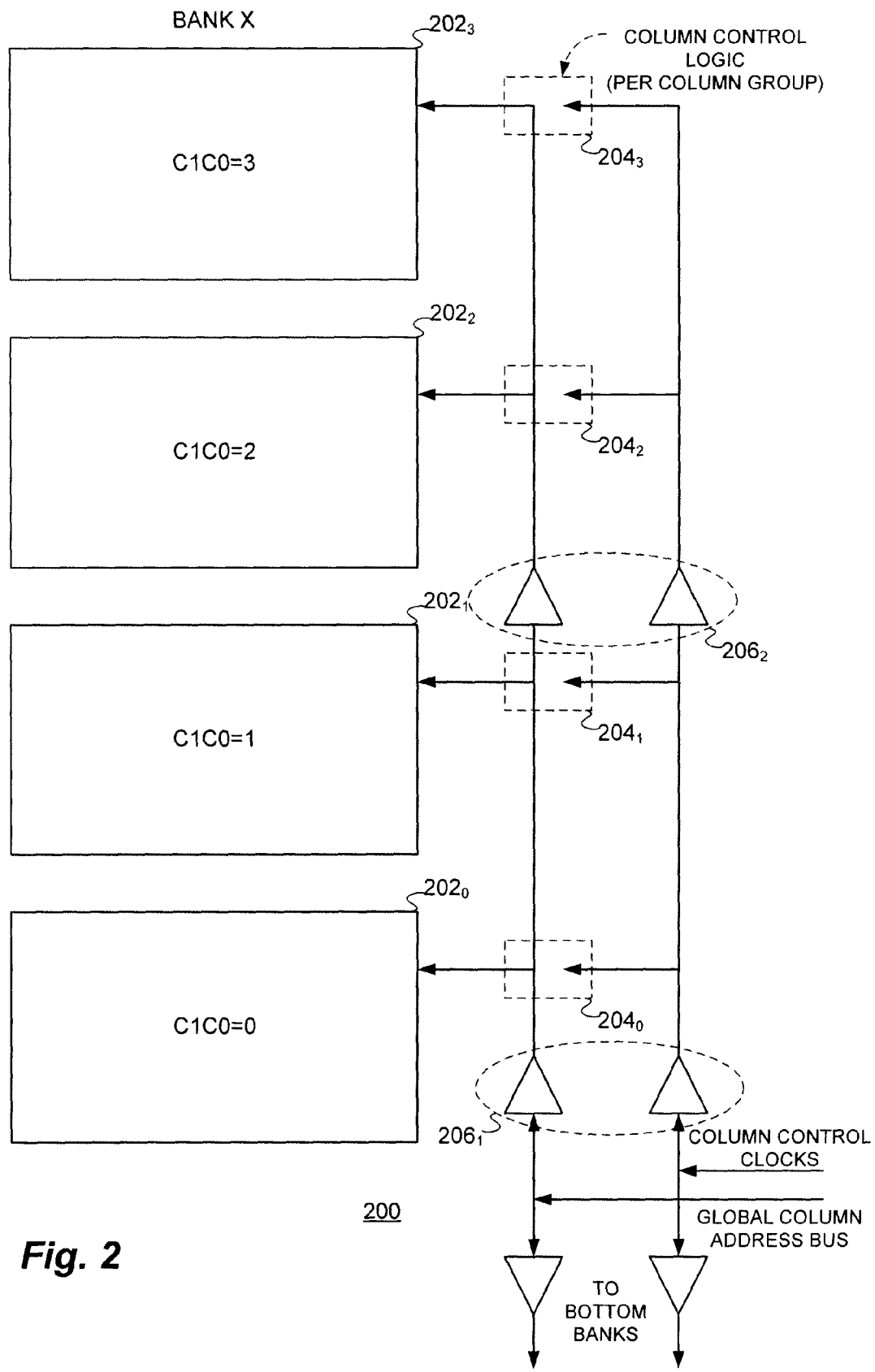
FIG. 2 is an additional architectural block diagram of a portion of the memory bank configuration of the preceding figure illustrating a possible column address bus implementation for a memory device in accordance with the technique of the present invention.

With reference additionally now to FIG. 2, an additional architectural block diagram of a portion of the memory bank configuration of the preceding figure is shown illustrating a possible column address bus implementation for a memory device 200 in accordance with the technique of the present invention.

The memory device 200 comprises a number of memory banks, of which a representative memory bank X is shown comprising sub-arrays with addresses C1C0=0, C1C0=1. C1C0=2 and C1C0=3 denominated as $202_0$ through $202_3$ respectively. The memory device 200 column control clocks and the global column address bus are input to the memory bank X (and other memory banks, not shown) through a first buffer circuit $206_1$ and then respectively applied through column control logic blocks $204_0$ and $204_1$ to sub-arrays $202_0$ and $202_1$. The same column control clocks and the global column address bus are also input to the memory bank X through a second buffer circuit $206_2$ and then respectively applied through column control logic blocks $204_2$ and $204_3$ to sub-arrays $202_2$ and $202_3$.

In accordance with the technique of the present invention, it is also possible to segment the column address bus between the lower "fast pre-fetch" groups and the top slower ones. While this adds some delay to the top/slow group it nevertheless lessens the load on the lower group thereby enabling the column address to arrive faster. The added delay to the top/slow group simply need be less than that which would cause the data to be late at the I/O buffer.

While there have been described above the principles of the present invention in conjunction with a specific device architecture, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device comprising:
   a memory array including at least one memory bank presenting a plurality of column address fields;
   a separate data bus coupled to each of said plurality of column address fields of said memory bank and to a main data bus of said memory array;
   wherein at least two of said separate data buses present asymmetric delays from said column address fields to said main data bus based upon a starting address of a pre-fetch field defined by a single access.

2. The integrated circuit device of claim 1 wherein said memory array comprises a plurality of memory banks presenting corresponding ones of said column address fields, first ones of said corresponding column address fields associated with first pre-fetch data for a read access to said memory array being located most proximate to said main data bus of said memory array.

3. The integrated circuit device of claim 2 wherein said first ones of said corresponding column address fields are coupled together prior to being re-driven onto said main data bus.

4. The integrated circuit device of claim 3 wherein other ones of said corresponding column address fields are selectively re-driven prior to being coupled together and re-driven onto said main data bus.

5. The integrated circuit device of claim 4 wherein said separate data buses coupled to said first ones of said corresponding column address fields are shorter than said separate data buses coupled to said other ones of said corresponding column address fields.

6. The integrated circuit device of claim 4 wherein said separate data buses coupled to said first ones of said corresponding column address fields present shorter signal delays to said main data bus than said separate data buses coupled to said other ones of said corresponding column address fields.

7. The integrated circuit device of claim 4 wherein said separate data buses coupled to said first ones of said corresponding column address fields present fewer pipeline stages to said main data bus than said separate data buses coupled to said other ones of said corresponding column address fields.

8. The integrated circuit device of claim 4 wherein said separate data buses coupled to said first ones of said corresponding column address fields are responsive to fewer clocking signals prior to said main data bus than said separate data buses coupled to said other ones of said corresponding column address fields.

* * * * *